(12) United States Patent
Balistreri et al.

(10) Patent No.: US 6,218,886 B1
(45) Date of Patent: Apr. 17, 2001

(54) DEVICE FOR COMPENSATING PROCESS AND OPERATING PARAMETER VARIATIONS IN CMOS INTEGRATED CIRCUITS

(75) Inventors: Emanuele Balistreri, Battipaglia; Marco Burzio, Grugliasco, both of (IT)

(73) Assignee: Cselt - Centro Studi E Laboratori Telecomunicazioni S.p.A., Turin (IT)

(*) Notice: Subject to any disclaimer, the term of this patent is extended or adjusted under 35 U.S.C. 154(b) by 0 days.

(21) Appl. No.: 09/452,643

(22) Filed: Dec. 1, 1999

(51) Int. Cl.[7] .................................................. H03K 17/14
(52) U.S. Cl. ............................ 327/378; 327/513; 327/362
(58) Field of Search ..................................... 327/378, 307, 327/362, 513, 538, 540

(56) References Cited

U.S. PATENT DOCUMENTS 5,303,191 * 4/1994 Eagan et al. ........................... 327/540
5,477,176 * 12/1995 Chang et al. ......................... 327/143
5,994,945 * 11/1999 Wu et al. .............................. 327/378

* cited by examiner

Primary Examiner—Toan Tran
(74) Attorney, Agent, or Firm—Herbert Dubno

(57) ABSTRACT

A device (DC) is provided for compensating process and operating parameters variations in a CMOS integrated circuit. The device comprises means (CP, CT) for generating a first and a second compensation signals which depend on quality indexes of the fabrication process of the P and N transistors of the integrated circuit and on the operating temperature, and which are capable of compensating deviations of the controlled quantity from the desired value, due to the deviation of the quality indexes and temperature, respectively, from a typical value which would originate the desired value for the output parameter. The compensating device also can be implemented in the form of CMOS integrated circuit, preferably jointly with the device (OS) to be subjected to compensation (FIG. 1).

13 Claims, 3 Drawing Sheets

DEVICE FOR COMPENSATING PROCESS AND OPERATING PARAMETER VARIATIONS IN CMOS INTEGRATED CIRCUITS

This invention relates to CMOS analogue integrated circuits and in particular concerns a device for compensating the process and operating parameter variations in such circuits.

A CMOS integrated circuit is manufactured by making use mainly of P channel transistors and N channel transistors. The characteristics and performance of the individual transistors depend on the characteristics of the technological processes that have led to their creation on the integrated circuit as well as on the operating conditions. Thus they may vary from one specimen to another of the same circuit, as well as during the use of a same specimen. Furthermore, the fabrication processes of the two types of MOS transistor differ, thus making their variability ranges partially uncorrelated and quantitatively inhomogeneous.

All this results in a fluctuation of the value of the output quantity of the integrated circuit including the transistors about a mean value. This mean value may represent in practice a more likely value (or the nominal value), corresponding to process and operating conditions that are usually denoted as "typical".

If, for the sake of clarity, attention is focussed on an integrated circuit whose output quantity is tuneable by acting on the value of an appropriate control quantity, such as for instance a current-controlled oscillator, the variations of the characteristics of the transistors result in a variation of the output quantity (controlled quantity) for a given value of the control quantity. The amplitude of the fluctuations may typically reach ±50% as far as the influence of the process is concerned, and ±30–40% as far as the influence of the operating conditions is concerned. These fluctuations are additive, so that in the worst case a deviation of ±80–90% from the nominal value may take place, and this obviously causes serious problems.

It is therefore clear the interest of manufacturers and users of integrated circuits of this type to have circuits providing (at least with a good approximation) a desired value of the output quantity, regardless of the process results and operating conditions.

It is well known that the compensation of the fluctuations of the output quantity of a device can be obtained through the use of feedback loops that act on a control quantity. Said solution cannot be applied to the compensation of the fluctuations of the output quantity of an integrated device, in particular if this is a tuneable device.

As a matter of fact, on one hand it is desirable to manufacture also the feedback loop as an integrated circuit, and therefore the compensation means would suffer from the same problems of performance fluctuations as the device to be compensated. On the other hand, the feedback loop should be able to distinguish the variations of the output quantity actually due to the process or to the operating conditions from the variations due to a change in tuning, and its intervention should be avoided in the latter case.

According to the invention, a compensation device is provided which also can be implemented as an integrated circuit, preferably together with the device to be subjected to compensation. In particular, the invention applies to tuneable integrated devices wherein the value of an output quantity is determined by the value of a control quantity, and compensates the fluctuations of the output quantity by acting in open loop on the control quantity to bring it to such a value that, given the specific type of integrated circuit and the particular operating conditions, the input-output characteristic remains the one corresponding to process and operating conditions typical for the particular tuning value desired.

The circuit comprises:
means for generating a first compensation signal that depends on quality indexes of the fabrication process of the P transistors and of the N transistors of the device to be compensated, which indexes are determined in a calibration phase of the device, and that is representative, according to an inverse transfer function of the transfer function of the device, of a deviation of the controlled quantity from the desired value, caused by the deviation of said quality indexes from a typical value;
means for generating a second compensation signal representative, according to said inverse transfer function, of a deviation of the controlled quantity from the desired value, caused by the deviation of the operating temperature from a typical value, and
means for simultaneously applying said compensation signals to the control quantity, so as to generate in said control quantity such variations as to bring again the value of the output quantity to the desired value.

Preferably, said means for generating and applying the compensation signals form together with the device to be compensated an open loop structure and are they too manufactured as a CMOS integrated circuit.

So far neither circuits nor methods are known that act in such a way on integrated circuits. The work "Low-Jitter Process-Independent DLL and PLL Based on Self-Biased Techniques" by J. G. Maneatis, IEEE Journal of Solid State Circuits, Vol.31, No 11, November 1996, page 1723 and ff., suggests that the independence of the performance of loop integrated circuits from the process and environmental conditions can be achieved by eliminating the external bias, and making resort to a self-bias through which the device chooses the bias levels that guarantee its best performance. In practice, an action on current mirrors is envisaged so as to vary the current flowing through the circuit.

For a better clarification, reference is made to the accompanying drawings, wherein.

Figure 1:
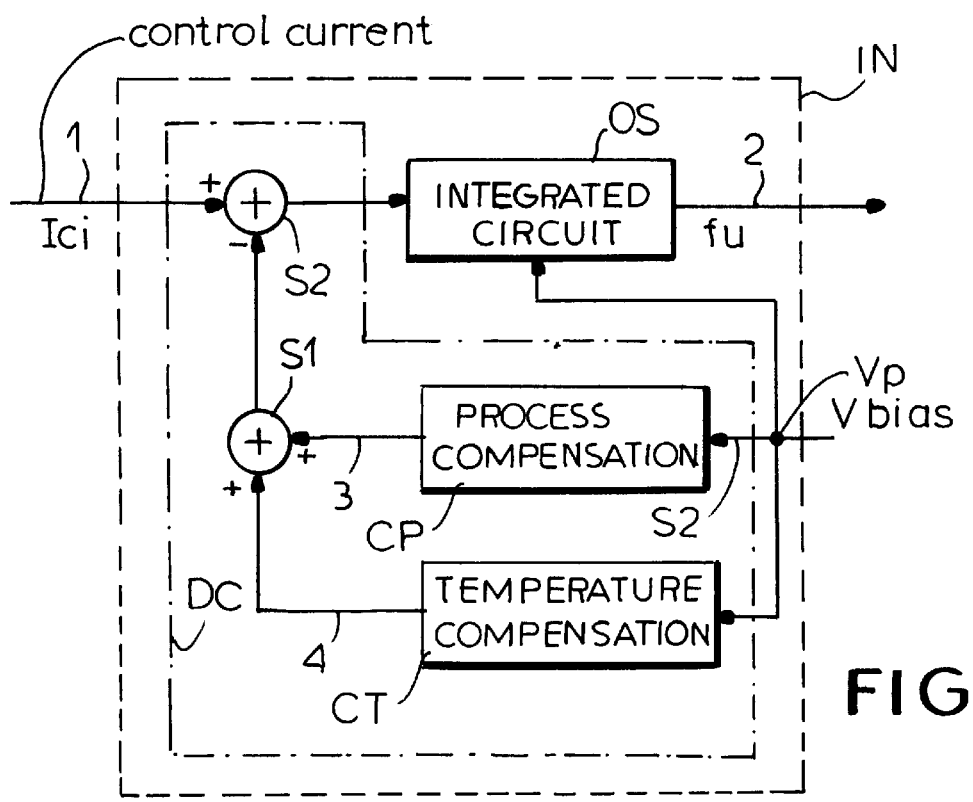
FIG. 1 is a block diagram of the device according to the invention.

Before describing in detail the circuit diagrams of the device according to the invention, the theoretical considerations on which the invention is based will be set forth.

In a linear analysis, the operation of an MOS transistor (either an N or a P transistor) may be represented through the relation:

$$Id = k(V_{gs} - V_T)^2 \qquad (1)$$

where Id is the drain current, $V_{gs}$ is the gate-source voltage, $V_T$ is the threshold voltage and k is a proportionality coefficient that depends on the mobility of the electrons or the holes and on the width W and the length L of the transistor, according to the relation $$k \propto \sqrt{\mu \frac{W}{L}} \qquad (2)$$

where the symbol denotes "approximately proportional".

The parameters that appear in the above relations are linked to the operating conditions and to the characteristics of the technological processes. With reference to the graph of the transconductance, which will not be shown here since it is well known, the variations of the parameters result in a horizontal translation of the representative curve due to the variation of the threshold voltage or in variation of its slope deriving from gain variations. In a neighbourhood of the operating point of the transistor, said curve may be regarded as approximately linear and the value of the drain current Id as a function of the voltage $V_{gs}$ may be expressed through the relation:

$$Id = g_m V_{gs} \tag{3}$$

where the quantity $g_m$, which may be called linear gain of the transistor, includes all the information relating to the threshold voltage as well as to the physical and geometric characteristics of the channel.

The performance of the transistors is then expressed by only one parameter, the variations of which show the spread of the relating characteristics. Thus it is evident that $g_m$ can be considered as an index representative of both the technological process quality and the operating conditions of the device. In particular, it will be possible to write $g_m$ as the sum of a constant term $g_{m0}$ dependent on the bias conditions and a variable term $g_{mv}$ relating to the spread.

In practice, although the terms $g_{mv}$ are nominally different for the various transistors in a given specimen of the circuit, the process and operating condition variations among different transistors within a same specimen of the integrated circuit may be considered as negligible in regard to the variations of the average characteristics among different specimens. It appears therefore reasonable to define a process quality index that expresses as a sum the average characteristics of the transistors of a same type on a particular specimen. The quality indexes of both transistor types are likely to have a Gaussian distribution, thus allowing the designer to refer to a typical implementation (with the average values of the quality indexes) and to consider then its deviations as a function of the occurrence probability.

In case of a tuneable integrated device, such as for instance a current-controlled oscillator, the spread of characteristics of the transistors results in a spread of the value of the controlled quantity Gu, for a given value of the control quantity Gi.

The spread of the controlled quantity Gu can be related to the variable parameters of the device and in particular it is possible to express its dependence on process quality indexes $\theta_n$ and $\theta_p$, for the N transistors and the P transistors respectively, and on the temperature T. Thus, the following may be written $$Gu = f(\theta_n, \theta_p, T) \tag{4}$$

The indexes $\theta_n$, $\theta_p$ may coincide with $g_{mv}$ or $g_m$, depending on whether zero mean indexes (i.e. with 0 value under typical conditions) are considered or not.

The specific function f will of course depend on the type of device being considered and in general it will not be possible to express it analytically, though it may be intuitively foreseen that it will be a monotonic function. As far as the dependence on the quality indexes $\theta_n$ and $\theta_p$ is concerned, taking also into account their small variances, one may consider only the portion of the representative curve in a neighbourhood of the average values, which portion, for simplicity but without any loss of generality, may be considered as approximately linear.

As far as the dependence on the temperature is concerned, the behaviour of the output quantity may be regarded as linear (at least within an interval 0° C.–80° C., that is a temperature interval rather typical for the operation of the integrated circuits). Relation (4) may then be written as follows:

$$Gu = \alpha\theta_n + \beta\theta_p + \gamma t + Gu0 \tag{5}$$

where t denotes the difference between the operating temperature T and a typical temperature T0, normally 27° C., and Gu0 is the value of the controlled quantity corresponding to the typical conditions (assuming for the sake of simplicity that $\theta_n$ and $\theta_p$ have zero mean value). Hence the three coefficients $\alpha$, $\beta$, $\gamma$ are representative of the deviations of the output quantity from the typical value as a result of the variations of their respective parameters.

The invention is based on the consideration that, if the variations of the process and operating parameters cause a fluctuation of the controlled quantity, their effect is equivalent to a variation of the control quantity: hence it may be considered modulating the control quantity in such a way as to obtain the output value Gu0 or a value which deviates from Gu0 within predefined and in any case extremely narrow limits.

The method to achieve the compensation may be the following. As a first operation, the different parameters appearing in (5) must be determined, and this can be done by determining the value Gu under different process and operating conditions. The value Gu0 will be determined assuming typical process and operating conditions. The value $\gamma$ is determined by varying the temperature only. By keeping the temperature at the value T0 and by varying the process quality indexes $\theta_n$ and $\theta_p$, it is possible to determine $\alpha\theta_n + \beta\theta_p$, from which, $\theta_n$ and $\theta_p$ being known, $\alpha$ and $\beta$ will then be derived.

It is recalled in this context that, as well known to the person skilled in the art, from an integrated circuit one may obtain quantities that can be easily measured and that vary in a known way as a function of the quality of the process, therefore allowing the determination of $\theta_n$ and $\theta_p$.

Once the different parameters and their respective coefficients are known and by denoting with H the transfer function of the device—i.e. by setting Gu=H(Gi)—the compensation circuit will have to supply a compensation signal $H^{-1}(\alpha\theta_n + \beta\theta_p + \gamma t)$, where $H^{-1}$ is the inverse of the function H.

This correction corresponds in practice to keeping constant the input-output characteristic of the device, for a given tuning value desired.

The determination of the various parameters may be carried out advantageously through simulation when designing the integrated device to be compensated and the control circuit: as a matter of fact, it is well known that the integrated devices are designed through automatic techniques which, by using mathematical models of the building elements adopted (transistors), allow both predicting the behaviour of the device under the different operating conditions and evaluating the performance variations as a function of the variation of the specimens which will be manufactured, on the basis of the statistics on the characteristics of the building elements that the manufacturer provides.

Alternatively, if the device to be compensated is implemented separately from the compensation means, one can perform the actual measurement of the parameters of interest, provided of course the device is available in a quantity of specimens sufficient to guarantee significant information on the behaviour of the quality of the process.

The block diagram of a device according to the invention may be as shown in FIG. 1, which refers by way of an example to the case in which the device to be subjected to compensation is a current-controlled device, for example an oscillator OS. In this case, the control quantity Gi and the controlled quantity Gu are a current Ici, present at an input 1, and an oscillation frequency $f_u$, respectively, the latter being presented at an output 2. The oscillator OS is associated with a first compensation circuit CP aimed at compensating the fluctuations of the process parameters and a second compensation circuit CT, aimed at compensating the temperature variations. Two separate compensation circuits have been indicated, since, as will be better understood in the sequel, the terms that in relation (5) represent the compensation of the process effects ($\alpha\theta_n+\beta\theta_p$) and the term representing the temperature compensation ($\gamma t$) are actually determined through circuits which are separate and of a different structure. Outputs 3, 4 of the two circuits CP, CT are connected to an adder S1, whose output is then connected to the negative input of a subtractor S2, which receives the control current at its positive input.

It must be observed that this arrangement corresponds to considering a linear behaviour of the whole of the device OS to be subjected to compensation and of the compensation device DC.

The set of the circuits CP, CT, S1, S2 that form the compensation device DC is advantageously a part of an integrated circuit IN, which also comprises the oscillator OS. Reference Vp denotes the bias voltage common to the various parts of circuit IN.

The element CP for the compensation of the process fluctuations, i.e. the element responsive to the parameters $\theta_n$, $\theta_p$, is an element with a differential structure where the distribution of the overall current among the two branches depends on the ratio of the gains of two transistors, an N transistor and a P transistor. The adoption of a differential structure makes it possible in particular to split up the coefficients $\alpha$, $\beta$ into two terms, namely a differential term, $\alpha_d$ and $\beta_d$ respectively, that determines the sensitivity of an index relative to the other, and a common mode term, $\alpha_c$ and $\beta_c$, respectively, that affects the absolute value of the variation entity. The differential components of the sensitivity-to the quality indexes $\theta_n$ and $\theta_p$ are determined by the unbalancing in the geometrical characteristics of the transistors, whereas the common mode components that quantify the sensitivity of the individual transistors to the relating quality parameter are represented by the absolute values of the geometrical characteristics.

Figure 2:
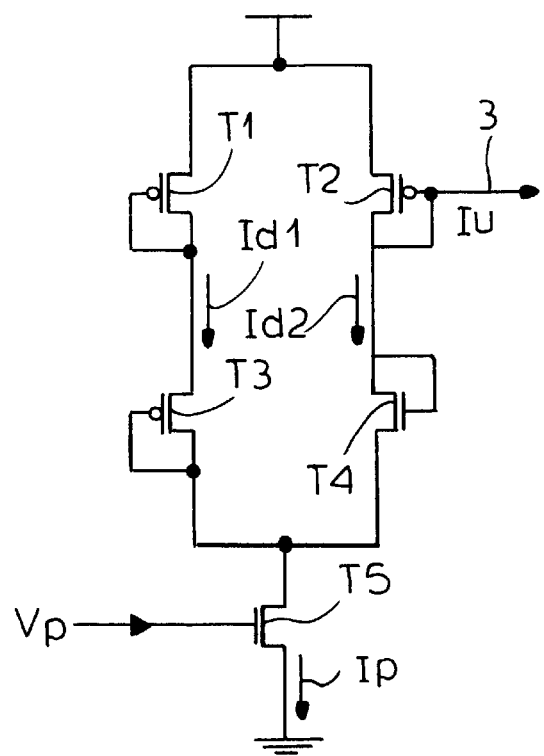
FIGS. 2 and 3 are circuit diagrams of the elements forming the compensation device.

In greater detail, as is shown in FIG. 2, the block CP consists of a set of transistors T1–T5 connected in a circuit configuration that is similar to that of a differential amplifier, as is clear to the person skilled in the art. Like in a differential amplifier, the transistors T1, T2 represent the load and the transistor T5 is the bias transistor, that receives at its gate the bias voltage Vp. Contrary to an actual differential amplifier, the transistors T3, T4 do not have any task of amplification of an outside signal and only have functions of process detectors. Thus, they are connected in diode configuration and, in order the circuit is sensitive to both types of process, they have complementary doping (in particular T3 is a P transistor, and T4 is an N transistor).

The operation of the element just described may be immediately understood from an analysis of its structure. If Ip denotes the bias current (drain current of T5) and Id1, Id2 denote the currents flowing through the branches of the circuit, in an equilibrium condition ($V_{gs}$ of T3, T4 being equal) there will be Ip=Id1+Id2. That condition corresponds to a certain value of the output current Iu, taken for instance from the transistor T2, and said current is given by Iu=Id1−Id2. As the quality of the process varies, the current that flows through one of the transistors T3, T4, for a same value of $V_{gs}$ with respect to the equilibrium condition, varies (in particular that current will increase if the process has originated a faster transistor and will decrease in the opposite case) and the output current Iu will then have a corresponding variation range. It will be then sufficient to determine, during the design of the differential element, the sizes of the transistors T3, T4 in such a way that the output current Iu actually is the one that would cause a variation $\alpha\theta_n+\beta\theta_p$ of the oscillation frequency (i.e. $Iu=H^{-1}(\alpha\theta_n+\beta\theta_p)$), thereby obtaining the corrective factor required.

It must be noted that the operation just described assumes a very stable current Ip, that may be generated outside the circuit.

Figure 4:
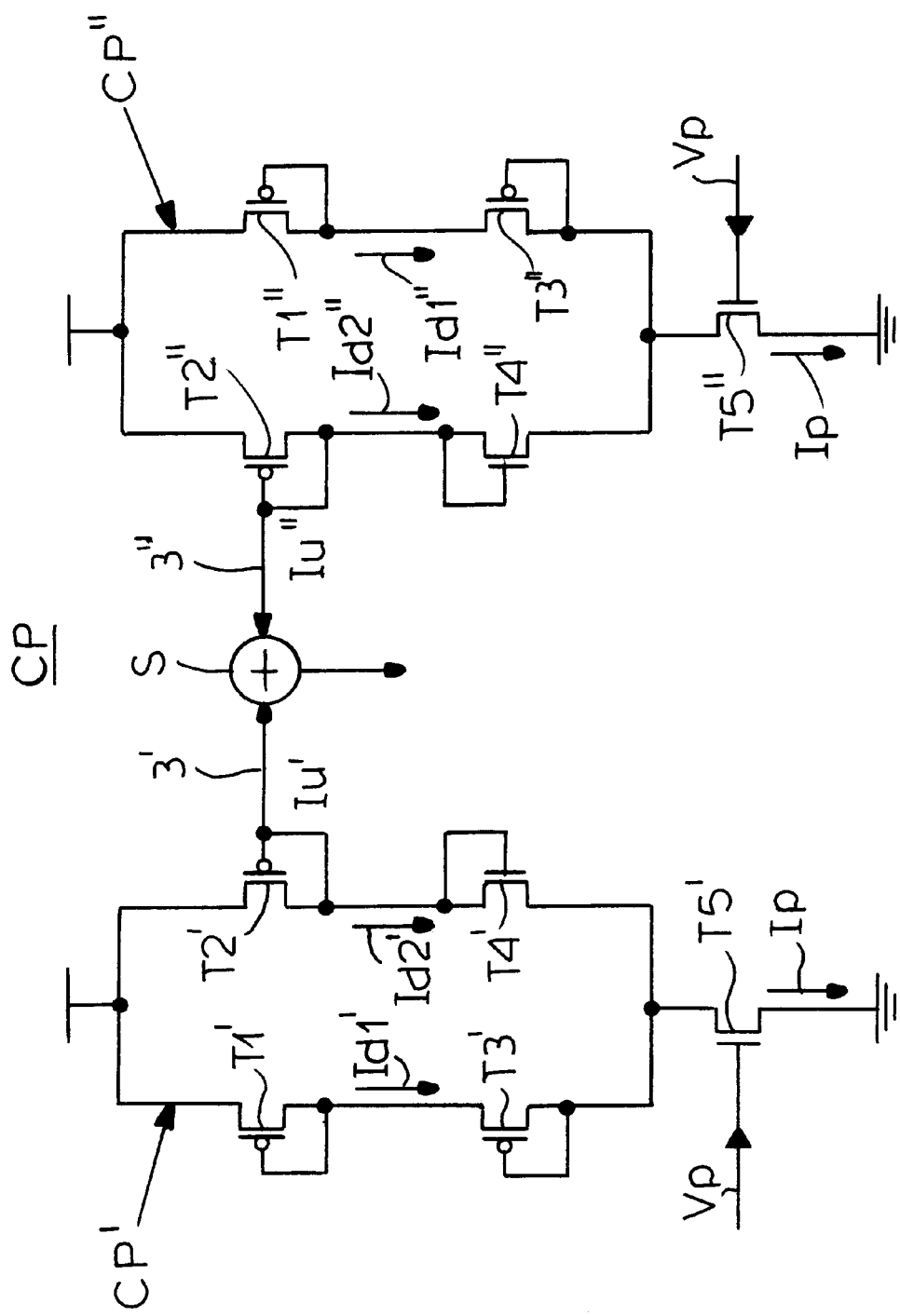
FIG. 4 is a variant embodiment of FIG. 2

It is also possible to think of a compensation unit CP of, say, universal type, including, as shown in FIG. 4, two units CP' and CP" of the kind shown in FIG. 2, connected together. For the elements in the two units reference symbols corresponding to those of the elements in FIG. 2 have been used, yet with a prime (T1' ... T5', Id1', Id2', 3', Iu') for CP' and a double prime (T1' ... Iu") for CP". The transistors corresponding to T3, T4 (FIG. 2) in one of the units (for instance, transistors T3', T4'in CP') shall be transistors with substantially equal dimensions, whilst the other unit shall use corresponding transistors T3", T4" with strongly unbalanced dimensions. Under such conditions, CP' will supply on output 3' a current Iu' that changes in one direction or in the opposite one according to whether the difference between the process quality indexes increases or decreases and thus represents a unit sensitive to differential process variations. CP" will be instead particularly sensitive to the quality variations of the fabrication process of the smaller transistor (for instance, transistor T4" of N type, since, as is known, in case of diode-connected transistors, the N transistors are more affected by variations of the fabrication process, and by reducing their size their gain increases). The compensation signal Iu will be obtained as a linear combination of the output signals Iu', Iu" of the two elements. The linear combination allows taking into account the variations of the fabrication process of the P transistors. The means carrying out the linear combination is represented here for sake of simplicity by a simple adder S, but of course signals Iu', Iu" can be suitably weighted for the combination.

The temperature-responsive element is substantially a generator of a current reference in which, as is typical for such generators, the voltage drops across a pair of detectors having such voltage-current characteristics as to offer a stable crossing point (equilibrium point), are made equal, and in which the working point of the generator is kept at the equilibrium point through a feedback circuit. The adopted structure provides a current that is practically independent of the process and of the power supply and is instead highly sensitive to temperature.

Figure 3:
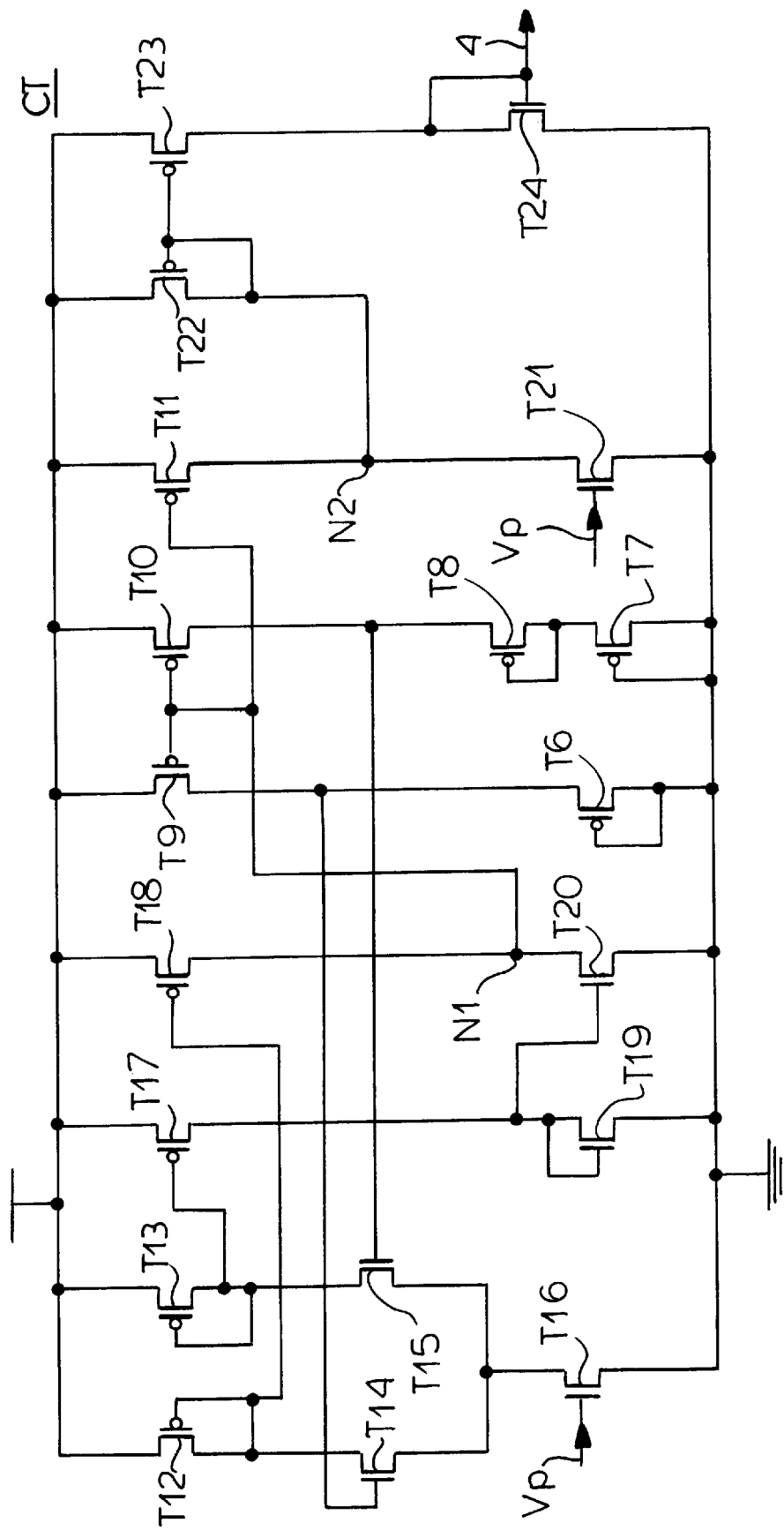

With reference to FIG. 3, a transistor T6, which is connected in diode configuration and is in particular a P transistor, represents the first detector, whilst a pair of transistors T7, T8, of the same type as T6 and connected in series, represent the second detector. The transistor T6 has transconductance (or gain) characteristics considerably different from those of the transistors T7, T8, so that there exists, and can be actually reached, an equilibrium point of the circuit different from point (0,0) of the current-voltage characteristics.

In particular, the transistor T6 has a very low transconductance, whereas the transistors T7, T8 have a very high transconductance. The transistor T6 and the transistor pair T7, T8 are implemented very close to each other within the integrated circuit. Being the transistors of the same type, this ensures a good independence of the characteristics from the technological process: as a matter of fact, it is straightforward that any fluctuations in the outcome of the technological process will affect to the same extent both detectors. Further, in order to improve such an independence, the detectors have been implemented through P type transistors, since said transistors, if connected in diode configuration as in the diagram, exhibit a more homogeneous variation of the characteristics as the process varies, thus making the device less sensitive to the process itself.

Transistors T9, T10, they too of P type, represent a first current mirror destined to inject into both detectors a same current I(t), that is the one corresponding to the above-said equilibrium point. The current I(t) is also mirrored by an additional transistor of P type, T11.

A set of transistors T12–T16 implements a differential amplifier that represents the feedback circuit and is destined to generate a voltage signal to be supplied to the transistors T9–T11, in order to keep the circuit at the equilibrium point as the power supply voltage varies. This voltage signal is representative of the difference of the current flowing through the transistors T12–T13, which difference is obtained through the transistors T17–T20. The voltage across the two detectors is applied to the gate of the transistors T14, T15 respectively. The feedback signal is derived from a node N1 to which the drain electrodes of the transistors T18 and T20 are connected. The transistors of the differential amplifier are chosen in such a way as to provide such a gain as to stabilise the working point with a high accuracy, for instance in the order of the millivolts.

An N transistor T21 is driven by the constant bias voltage Vp and thus provides a constant current δIo. The drain electrodes of T21 and T11 are connected together and form a subtraction node N2 which supplies therefore the current δIo–I(t). This current is then applied to an additional current mirror, formed by the transistors T22, T23, still of P type, and finally applied to a transistor T24, that is connected in diode configuration and presents it at the output 4.

Since I(t) varies as a function of the temperature (in a substantially linear way), through an adequate dimensioning of T21 (therefore through an appropriate choice of δ) it will be obviously possible to act so that δIo–I(t) actually has the value $H^{-1}(\gamma t)$ The person skilled in the art will readily appreciate that the diagrams illustrated in FIGS. 2, 3 may be easily implemented in the form of a CMOS integrated circuit and therefore inserted into a same chip with the device to be compensated.

Tests performed on current-controlled oscillators have proven that the invention allows keeping the oscillations of the output frequency within an interval of ±20%, for the typical variation ranges of the processes mentioned above and within a temperature interval from 0 to 80°. Therefore a clear improvement in performance is achieved with respect to conventional devices.

It is evident that what has been described is solely given as by way of a non limiting example and that variations and modifications are possible without departing from the scope of the invention. In particular, even if in the description reference has been made to a current-controlled device, since this control is usual in CMOS integrated circuits, and therefore FIGS. 2 and 3 show circuits capable of generating current compensation signals, the same circuits may be used to perform the compensation of a voltage controlled device, with the straightforward addition of an element capable of deriving the corresponding voltage signal from the current signal. In general it can be said that the invention is applicable to all the cases in which a control quantity may be modified by the combination with a homologous compensation quantity. Obviously in case of a tuneable device, the variation of the control quantity must not vary the tuning conditions.

What is claimed is:

1. Circuit (DC) for compensating the fluctuations of the value of an output quantity (fu) in a CMOS integrated device (OS) comprising P transistors and N transistors, in which the value of such output quantity (fu) depends on the value of a control quantity (Ici) according to a given transfer function and may exhibit, for a given value of the control quantity (Ici), fluctuations due to fluctuations of the characteristics of the manufacturing process of said transistors and to the operating temperature variations, the circuit (DC) being characterised in that it comprises:

means (CP) for generating a first compensation signal that depends on quality indexes of the manufacturing processes of the P and the N transistors in said integrated device (OS), which indexes are determined in a calibration phase of the device, and that is representative, according to an inverse transfer function of said given transfer function, of a deviation of the output quantity value from the desired value due to the deviation of said quality indexes from a typical value;

means (CT) for generating a second compensation signal representative, according to said inverse transfer function, of a deviation of the output quantity from the desired value due to the deviation of the operating temperature from a typical value; and means (S1, S2) for simultaneously applying said compensation signals to the control quantity so as to generate into said control quantity such variations as to restore the value of the output quantity to the desired value.

2. Circuit according to claim 1, characterised in that said means (CP, CT, S1, S2) for generating and applying the compensation signals form with the integrated device (OS) an open loop structure and are they too implemented in the form of a CMOS integrated circuit.

3. Circuit according to claim 1, characterised in that said means (CP, CT, S1, S2) for the generation and application of the compensation signals are part of an integrated circuit (IN) that also comprises the device (OS) to be compensated.

4. Circuit according to claim 1, characterised in that the means (CP) for the generation of the first compensation signal are arranged to compensate a deviation of the output quantity which is represented by a linear combination of said quality indexes according to proportionality factors α, β determined in said calibration phase, and the means (CT) for the generation of the second compensation signal are capable of generating a signal that is destined to compensate a deviation of the output quantity that is proportional to the difference between an actual operating temperature and a typical temperature according an additional proportionality factor γ, also determined in said calibration phase.

5. Circuit according to claim 1, characterised in that said integrated device (OS) is a device operating in a region of its input-output characteristic in which the value of the output quantity linearly depends on the control quantity and the means (S1, S2) for applying said compensation signals are arranged to algebraically add the compensation signals to the input quantity.

6. Circuit according to claim 1, characterised in that said integrated device (OS) is a device that can be tuned on a desired value of the output quantity by acting on said control quantity, and said means (CP, CT) for the generation of the first and second compensation signals are arranged to generate compensation signals such as to keep the output quantity to said value on which the device is tuned.

7. Circuit according to claim 1, characterised in that said means (CP, CT) for the generation of the first and second compensation signals are arranged to generate current compensation signals.

8. Circuit according to claim 1, characterised in that the means (CP) for the generation of the first compensation signal comprise a first set of transistors (T1 . . . T5) connected according to a differential configuration which has two branches, each comprising a transistor (T3, T4) responsive to the manufacture process connected in series to a respective load transistor (T1, T2), and which is arranged to supply an output current representative of the difference between the currents flowing in the two branches, and in which the transistors (T3, T4) responsive to the process are connected in diode configuration, have a channel complementary doping and such geometrical characteristics that said difference between the currents flowing in the two branches produces a deviation of the output quantity of which the absolute value is given by said linear combination of the quality indexes.

9. Circuit according to claim 1, characterised in that the means (CP) for the generation of the first compensation signal comprise:
- a first unit (CP') comprising a second set of transistors (T1' . . . T5') connected according to a differential configuration which comprises two branches, each one with a transistor (T3', T4') responsive to the manufacture process connected in series to a respective load transistor (T1', T2'), wherein said first unit is arranged to provide an output current (Iu') representative of the difference between the currents flowing in the two branches and the transistors (T3', T4') responsive to the process are connected in diode configuration, have a channel complementary doping and substantially have the same geometric characteristics, so as to be sensitive to variations in the the difference betwwen the quality indexes among different specimens of the integrated device (OS);
- a second unit (CP") comprising a third set of transistors (T1" . . . T5") which are connected in the same way as the transistors (T1' . . . T5') of the second set and in which the two transistors (T3", T4") responsive to the process have strongly different sizes, so as to be sensitive to the variation of the quality index of the smaller transistor among different specimens of the integrated device (OS), means (S) for the linear combination of the output currents (Iu', Iu") of said second and third sets of transistors (T1' . . . T5'; T1" . . . T5"), said linear combination means (S) providing a resulting current the value of which gives rise to a deviation of the output quantity with an absolute value given by said linear combination of quality indexes.

10. Circuit according to claim 8, characterised in that in said first and third sets of transistors (T1 . . . T5; T1" . . . T5"), the N type transistor responsive to the process has a smaller size than the P type transistor responsive to the process.

11. Circuit according to claim 1, characterised in that the means (CT) for the generation of the second compensation signal comprise a generator of a current varying as the temperature varies, the generator including:
- a first and a second element (T6, T7, T8) that have respective current-voltage characteristics with such a behaviour as to give rise to an intersection point to which said varying current corresponds and that are formed, respectively, by an individual transistor (T6) and by a first pair of series-connected transistors (T7, T8), having the same type of doping as the individual transistor (T6);
- a first current mirror (T9, T10, T11), to inject a same current, variable with temperature into said two elements (T6, T7, T8);
- a differential amplifier (T12 . . . T20) that receives at its inputs the voltage present across said first and second element (T6, T7, T8) and supplies said current mirror (T9, T10, T11) with a control signal represented by the difference between the currents flowing through the two branches of the amplifier and such as to keep the generator at said working point;
- an additional transistor (T21), connected to a reference voltage source and arranged to provide a fixed current the value of which is linked, according to said inverse transfer function, to said third proportionality coefficient, said additional transistor (T21) and an output transistor (T11) of said mirror sharing a same electrode, which constitutes a subtraction node (N2) for their respective currents.

12. Circuit according to claim 11, characterised in that said individual transistor (T6) and the transistors (T7, T8) of said pair are P transistors.

13. Circuit according to claim 8, characterised in that it comprises means for obtaining respective voltages from the output currents of the means (CP, CT) for the generation of the first and second compensation signal, to effect the compensation on a voltage-controlled device.

* * * * *